United States Patent [19]

Khasat et al.

[11] Patent Number: 5,268,232
[45] Date of Patent: Dec. 7, 1993

[54] DICYCLOPENTADIENE POLYMERS WITH HEAT-RESISTANT DIMENSIONAL INTEGRITY AND HIGH $T_g$

[75] Inventors: Nitya P. Khasat, Newark; John F. L. Newport, Wilmington, both of Del.

[73] Assignee: Hercules Incorporated, Wilmington, Del.

[21] Appl. No.: 775,393

[22] Filed: Oct. 15, 1991

[51] Int. Cl.⁵ .................. B32B 27/28; B32B 27/32
[52] U.S. Cl. ................... 428/521; 428/212; 526/222; 526/225; 526/283
[58] Field of Search ............ 526/222, 225, 283; 428/521, 212

[56] References Cited

U.S. PATENT DOCUMENTS

| | | | |
|---|---|---|---|
| 4,400,340 | 8/1983 | Klosiewicz | 264/328.6 |
| 4,568,660 | 2/1986 | Klosiewicz | 502/169 |
| 4,948,856 | 8/1990 | Minchak et al. | 526/281 |
| 5,011,730 | 4/1991 | Tenney et al. | 428/209 |
| 5,081,208 | 1/1992 | Sjardijn | 526/166 |
| 5,093,441 | 3/1992 | Sjardijn et al. | 526/126 |

*Primary Examiner*—P. C. Sluby
*Assistant Examiner*—D. S. Nakarani
*Attorney, Agent, or Firm*—Roy V. Jackson

[57] ABSTRACT

A molded article comprising a cross-linked ring-opened polymer produced by the metathesis polymerization of a dicyclopentadiene (DCPD) monomer, which may be dicyclopentadiene (DCPD) or of a mixture of (DCPD) and norbornene group-containing cycloolefins, in the presence of an effective amount of a metathesis polymerization catalyst and a co catalyst that is capable of crosslinking the unsaturated double bonds of the polymer and thereby increasing the crosslink density of the polymer and its $T_g$, a process for making it, a process for increasing the $T_g$ of the molded article, and uses of the molded article with a high $T_g$.

6 Claims, No Drawings

DICYCLOPENTADIENE POLYMERS WITH HEAT-RESISTANT DIMENSIONAL INTEGRITY AND HIGH $T_g$

This invention relates to polymers of norbornene-type monomers or mixtures of such monomers, more specifically polymers of dicyclopentadiene that optionally contain one or more other norbornene type comonomers, and processes for making them.

BACKGROUND OF THE INVENTION

Thermoset polymers of strained ring polycyclic cycloolefins are extensively used for making molded structural articles. The preparation of these polymers, usually based on dicyclopentadiene, is known, for example, from U.S. Pat. No. 4,400,340, which describes a reaction injection molding (RIM) technique in which a reactant stream containing a monomer to be polymerized and a metathesis catalyst, and a second stream containing a catalyst activator and additional monomer are brought together in a mixing head and substantially immediately injected into a mold where the monomer polymerizes to form a shaped article matching the shape of the mold. The polymerization involves the opening of a cycloolefin ring, and the monomers are described as being metathesis polymerizable. The reaction is catalyzed by a transition metal catalyst such as a tungsten or molybdenum salt, preferably tungsten halide or tungsten oxyhalide, activated by an alkyl aluminum compound or other conventional activator compound. Details of the catalyst preparation are well known, for instance from U.S. Pat. No. 4,568,660. The gelation stage of the polymerization, unless the reaction is moderated to delay it, takes place almost instantaneously. Such polymers can also be molded from a single stream, using a modifier to delay the gelation stage of the pre mixed ingredients.

Poly(dicyclopentadiene) and the other metathesis polymerization products, although they are extensively crosslinked, retain the unsaturation of the monomer. Although the double bonds are rearranged by the polymerization, they provide numerous reactive sites for further modification, either during or after the polymerization, and involving increased crosslink density.

These polymer compositions obtained by metathesis polymerization combine relatively high values of impact strength and flexural modulus, compared to other polymers, and they are insoluble in common solvents such as gasoline, naphtha, chlorinated hydrocarbons, and aromatics. However, they have a relatively low glass transition temperature ($T_g$), on the order of 125° to 140° C. for poly(dicyclopentadiene), and lack a desirable level of dimensional integrity or stiffness when subjected to an elevated temperature, that is, their "heat sag" performance level is low (by ASTM test 3769).

For many applications there is a need for thermoset polymers of norbornene-type monomers, such as poly(-dicyclopentadiene), that have higher values of $T_g$ than any otherwise comparable thermoset polymeric materials, as well as a higher level of "heat sag" performance.

SUMMARY OF THE INVENTION

In accordance with this invention, a molded article comprising a cross linked ring opened polymer produced by the metathesis polymerization of a dicyclopentadiene (DCPD) monomer, which may be dicyclopentadiene (DCPD) or of a mixture of (DCPD) and another norbornene group-containing cycloolefin, in the presence of an effective amount of a metathesis polymerization catalyst, which is conventionally a transition metal catalyst such as a tungsten or molybdenum salt, and a co catalyst, such as triflic anhydride (trifluromethane sulfonic anhydride), that is capable of crosslinking the unsaturated double bonds of the polymer and thereby increasing the crosslink density of the polymer and its $T_g$, the polymerization being in the presence of 0.4 to 5% by volume bawed on the total volume if the monomer, the co-catalyst being selected from the group consisting of trifluoromethane sulfonic anhydride, 1,2-diphenyl-tetramethyldisilane, 2,3-dimethyl-2,3-diphenylbutane, benzene-sufonic acid and trifluoroacetic anhydride, the molded article having a core/shell structure comprising a core that is sandwiched between the outer layers, and has a higher degree of dimensional integrity at higher temperatures and lower resistance to impact than the outer layers.

Preferably, the polymer article is produced by the metathesis polymerization of the said monomer in the presence of the said transition metal catalyst and from 0.4% to 5% of the co-catalyst (based on the respective volumes of the co catalyst and the monomer), the said product can have a unique core/shell structure, with a darker core (preferably amounting to about 30% of the weight of the article) that is apparent to visual observation, sandwiched between normal appearing outer "shell" layers. The core, which is highly crosslinked, provides stiffness at higher temperatures and the normally ductile outer layer provide good impact properties.

The preparation of such molded polymer articles comprises adding from about 0.4% to about 5% of the co-catalyst to a reactant liquid stream that conventionally contains dicyclopentadiene monomer and a ring-opening metathesis catalyst and is mixed with an activator for the metathesis catalyst, and charging the liquid to a mold or similar forming container in which the dicyclopentadiene monomer polymerizes to form a molded article which has the said unique core/shell structure. The conventional mold temperatures, of the order of 50° to 100° C. are appropriate, depending on the efficiency of the co-catalyst.

The molded article, produced by the metathesis polymerization of the said monomer in the presence of the said transition metal catalyst and a smaller amount, from 0.01% to 0.5% of the co-catalyst, (which depends on the efficiency of the co catalyst) may be heated in a postcuring step at a controlled temperature until the desired increase in the $T_g$ is achieved, for instance, amounting to an increase of up to about 200° C. The post cured composition can be used according to the invention as a matrix resin for glass or carbon fiber composites, for high temperature use requiring a high $T_g$, or as a dielectric support for electronic components of a circuit board.

The polymerization reaction may be carried out in the presence of the said transition metal catalyst and the larger amount, from 0.4% to 5%, of the co catalyst, and the temperature of the reaction is allowed to rise substantially above 200° C., to a point where a definite second exotherm can occur. The second stage polymerization is highly exothermic and the temperature rise must be controlled, for instance, by adjusting the heat transfer characteristics of the apparatus and cooling, to stop the autocatalytic reaction at a desired maximum temperature before it leads to temperature levels (e.g.

above 400° C.) that would cause thermal decomposition and carbonization.

Also according to the invention, a molded polymer article derived from the metathesis polymerization of dicyclopentadiene has a $T_g$ of at least 160° C., ranging up to 340° C.

DETAILED DESCRIPTION OF THE INVENTION

Although the most preferred co-catalyst is triflic anhydride, other co catalysts that are capable of cross-linking the unsaturated double bonds of the polymer may be free radical generators such as peroxides or cation generators, preferably cation generators. Particularly suitable co catalysts, other than the preferred triflic anhydride, are 1,2-diphenyltetramethyldisilane, 2,3-dimethyl-2,3-diphenylbutane, benzenesulfonic acid, and trifluoroacetic anhydride. The amount of cocatalyst, based on the volume of the monomer, is about 0.01–5%, preferably 0.05 to 0.5%, depending on the efficiency of the cocatalyst and the desired characteristics of the product. Within that range, the co catalyst concentration will affect the increase in the normal crosslink density of the polymer and its heat sag behavior, as well as the choice of the process used and the $T_g$ after post curing.

In particular, the crosslink density of the product of the invention is significantly affected by the choice of the cocatalyst, its concentration, and the extent of control of the exothermic polymerization. The control of the maximum temperature may be, for instance, by heat transfer via the mold. If the temperature is not controlled, the reaction can become autocatalytic, leading to temperature greater than 400° C. which would cause thermal decomposition and carbonization.

The $T_g$ of the product of the invention can be significantly increased by post curing at an appropriate combination of temperature and time that is selected depending upon the activity of the co-catalyst and is typically from about 200° C. to 230° C., preferably at about 210°–220° C. for about 30 minutes to an hour using triflic anhydride. At the lower concentration of cocatalyst (less than 0.4 vol%), the $T_g$ of the post-cured product is dependent on the catalyst concentration. For instance, at a co-catalyst concentration equal to or greater than 0.33, a $T_g$ of 340° C. can be obtained.

Cycloolefins containing at least one norbornene group that can be combined with dicyclopentadiene (DCPD) to form a metathesis polymerizable mixture with DCPD can amount to about 50 weight percent of the mixture, and are those cycloolefins that are conventionally combined with dicyclopentadiene to form thermoset copolymers, including norbornene, norbornadiene, phenyl norbornene, tetracyclododecene, tetracyclododecadiene, ethylidene norbornene, ethylidene tetracyclododecene, and tricyclopentadiene, as well as other higher cyclopentadiene oligomers.

Other comonomers that can be used are norbornene derivatives containing polar groups such as cyanonorbornene, norbornene carboxylic acid esters, and pyridyl norbornene. Preferred comonomers are the higher cyclopentadiene oligomers, tetracyclododecene and tetracyclododecadiene. Ethylidene norbornene may also be used as a comonomer with DCPD to take advantage of its freezing point depressant activity with DCPD.

Since half or more of the monomer is DCPD, the resultant polymer will polymerize and crosslink simultaneously, so preferably the metathesis polymerization is carried out in bulk by the reaction injection molding technique already referred to, or by resin transfer molding (with longer mold filling times), so that the reactive liquid polymerizes directly to the desired final shape. Preferably, the polymerization and molding are carried out by the RIM process. Each of the two reactive parts of the metathesis catalyst system is mixed with monomer to form a stable solution, which is placed in a separate vessel to provide the source for the respective reactive stream. The co catalyst is added to a reactant liquid stream that conventionally contains dicyclopentadiene monomer and the metathesis catalyst and is mixed with an activator for the metathesis catalyst before charging the liquid to a mold. Alternatively it may be added in a third or separate stream either in monomer or an appropriate solvent.

Normally, the two separate streams are combined in the RIM machine's mixing head and then injected into the mold where they quickly polymerize into a shaped structure. The mixing heads normally have orifices about 0.08 cm in diameter and a jet velocity of about 122 m/sec. For the injection, the mold is preferably maintained at a temperature from about 40° to about 100° C., with the mold pressure being preferably in the range of about 35 to 53 $N/m^2$ (10–15 psi).

The activator solution is conventionally modified to slow the rate of activation of the catalyst component and thus delay the onset of the polymerization reaction. Ethers, esters, ketones, nitriles, alkanols, sterically hindered amines and organic phosphites are conventionally used as rate moderators. Diglyme (diethylene glycol dimethyl ether), ethyl benzoate, and butyl ether are preferred, and preferably the moderators are used in a ratio of about 1.5 to 5 moles of moderator per mole of alkylaluminum compound. With such moderation, the exotherm may begin from a few seconds to several minutes after mixing of the streams, and the delay is determined by the characteristics of the RIM or RTM machine and mold, and the size of the article being molded.

The conventional metathesis-catalyst component of the ring opening metathesis polymerization system (procatalyst) comprises salts of transition metals such as tungsten, molybdenum, rhenium and tantalum, the more preferred salts being the chlorides and oxychlorides. Preferred tungsten compounds may be phenoxylated tungsten chlorides of the general formula

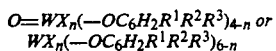

$$O=WX_n(-OC_6H_2R^1R^2R^3)_{4-n} \text{ or}$$
$$WX_n(-OC_6H_2R^1R^2R^3)_{6-n}$$

wherein n is 1–4 in the first formula and wherein n is 1–6 in the second formula and where $R_1$, $R_2$, and $R_3$ are hydrogen or straight or branched alkyl, aryl or aralkyl radicals of 1 to 10 carbon atoms, and X is chlorine. Such compounds are prepared by dispersing tungsten hexachloride or tungsten oxytetrachloride in an inert solvent and treating it with the stoichiometric amount of the phenol to substitute the desired number of phenolic radicals on the tungsten. Phenoxylation of the tungsten compound solubilizes it in DCPD and also effects changes in its catalytic reactivity and efficiency while increasing its resistance to air and moisture.

The tungsten-based catalysts can function as ionic polymerization catalysts for DCPD and if not stabilized, they may polymerize the DCPD on storage over several days. To increase the shelf life of the DCPD/catalyst solution, a Lewis base or a chelating agent may be added to the solution to complex the phenoxylated tungsten compound and deactivate it as an ionic polymerization catalyst. Preferred Lewis bases include nitriles and ethers such as benzonitrile and tetrahydrofuran. Preferred chelants include acetylacetones and alkyl acetoacetates, where the alkyl group contains from one to ten carbon atoms. The complexing step can be carried out before or after phenoxylation. Suitable complexes having the formula $WOCl_{4-x}(OAr)_x$ are actually quite stable in DCPD.

The other component of the catalyst system is the activator. The preferred activators are the alkyl aluminum compounds, particularly trialkylaluminums, dialkylaluminum halides and alkylaluminum dihalides in which the alkyl groups contain one to ten carbon atoms and the halide is chloride or iodide. A particularly preferred activator combination is a mixture of trioctyl aluminum and dioctyl aluminum, iodide. Other activators that can be employed conventionally include alkyl zinc compounds and alkyl tin compounds, in particular, trialkyl tin hydrides and silanes.

The following examples illustrate the invention.

PREPARATION OF ACTIVATOR CONCENTRATE

Under an inert atmosphere, a vessel is charged with the desired amount of tri-n-octylaluminum (TNOA). Next is charged the appropriate amount of di-n-octylaluminum iodide (DOAI), to give a mixture that is 85 mole % TNOA and 15 mole % DOAI. To that is carefully added 1 equivalent (based on total aluminum) of diglyme (bis-2-methoxyethyl ether) to control the evolution of heat during the exothermic reaction. The mixture is then diluted with the appropriate amount of dicyclopentadiene (DCPD) or an inert solvent such as toluene to give a solution 1.0M in aluminum.

Preparation of Catalyst Concentrate

Under an inert atmosphere (such as in a glove bag), a quantity of $WCl_6$ is weighed into a glass vessel (pop bottle) containing a magnetic stirring bar. The bottle is capped and removed from the glove bag. Next, a sufficient amount of dry toluene (or other aromatic solvent) is added to generate a 0.5M slurry. With stirring, 0.25 equivalent of t butanol (based on the tungsten) is slowly added. The HCl that is generated is swept from the vessel by a slow nitrogen sparge. After at least one hour, during which time the stirring and sparging is continued, 1.2 equivalent of nonylphenol (also based on the tungsten) is slowly added. The mixture is again allowed to stir for at least one hour while the sparge is continued.

Finally, 2.0 equivalent of acetylacetone (2.4 pentanedione) is added, and the mixture is allowed to stir and sparge for several hours. Any solvent lost during the sparging is made up, resulting in a 0.5M solution of a stabilized metathesis catalyst in toluene.

EXAMPLES 1 TO 5

The reactants for this experiment were prepared in 32 oz. pop bottles designated "A" and "B". Bottle "A" was capped and sparged and after adding 600 ml of dicyclopentadiene containing 3.5% EPDM rubber +2% ethylidene norbornene the bottle was put in an oil bath equipped with a magnetic stirrer. Bottle "B" was prepared in a similar fashion. 14.4 ml of 1M activator was added to the first bottle "A" and 9.5 ml of 0.5M tungsten metathesis catalyst was added to the second bottle "B", as well as the amount (1 to 5 ml) of co-catalyst specified in Table 1 as the respective example mixes 1A and 1B to 5A and 5B. The liquids from bottles "A" & "B" were transferred to the respective tanks of a "mini-RIM" machine to make plaques measuring 10.2 cm×20.3 cm×0.32 cm (4"×8"×0.125"). After being recirculated several times, the liquids were injected into the heated metal mold. The A & B liquids were mixed by impingement in the mixhead.

After completion of the reaction, the plaques were demolded, and used to obtain mechanical properties and residual 5 dicyclopentadiene results, which are listed in Table 1 as Example Properties 1 to 5. The mechanical properties after postcuring are listed in Table 2. The plaque from Example 5 (0.42% co catalyst) exhibited the core/shell structure in cross section.

EXAMPLE 6

This Example demonstrates the increase in $T_g$ and other mechanical properties that result from the process according to the invention. The reactants for this experiment were prepared as for Example 3 (see Table 1), except no rubber was used in this example. Seven carbon fiber (AS4) woven mats, each 3.75"×7.75", were placed in the cavity of the mold. The liquids from bottles "A" & "B" were transferred to the respective tanks of the mini RIM machine. After being recirculated several times, the liquids were injected into the heated mold and mixed by impingement in the mixhead to form composite plaques, each measuring 4"×8"×0.125" and with about 45 weight % carbon fibre. The plaques were then post cured for an hour at 220° C. and used to obtain the mechanical properties that are listed in Table 3.

EXAMPLE 7

The reactants for this experiment were prepared as for Example 3 (see Table 1), except only 2% EPDM rubber was used. 2 OCF 8608 glass fiber mats, each 3.75"×7.75" were placed in the cavity of the mold. The liquids from bottles "A" & "B" were transferred to the respective tanks of the mini RIM machine. After being recirculated several times, the liquids were injected into the heated mold and mixed by impingement mixing in the mix head to form composite plaques, each measuring 4"×8"×0.125" and with about 30 weight % glass fiber. Some of the plaques were then post-cured for 3 hours at 220° C. The mechanical properties before and after post curing are listed in Table 4.

Control Experiment

The reactants for this experiment were prepared as for Examples 1 to 5 in 32 oz. pop-bottles designated "A" and "B". After adding 600 mls of dicyclopentadiene, the bottle was put in an oil bath equipped with a magnetic stirrer. A second bottle was prepared in the similar fashion. This bottle also contained 16 gms of Irganox-1035 antioxidant. 14.4 ml of 1M activator was added to the first bottle "A" and 9.5 ml of 0.5M tungsten metathesis catalyst was added to the second bottle "B".

Plaques measuring 10.2 cm×20.3 cm×0.32 cm (4"×8"×0.125") were made, using a mini RIM machine, from the liquids from bottles "A" & "B", which were transferred to the respective tanks of the machine. After being recirculating several times, the liquids were injected into the heated metal mold. The A & B liquids were mixed by impingement in the mixhead.

After completion of the reaction, the plaques made from Examples 1 to 7 were demolded and used to obtain mechanical properties and residual dicyclopentadiene results, which are listed in Table 1 as example properties (see the column "Ex. Prop").

The plaque made from the Control Experiment was demolded and had the following properties: residual dicyclopentadiene, 2.5%; HDT, 85° C.; impact strength, 4.3 J/cm; $T_G$ 127°.

TABLE 1

| Ex. Mix | RDCPD (1) mls | Triflic Anhydride mls | Ex. | Res. DCPD % | HDT @ 264 psi °C. | Notched Izod ft-lbs/in | Heat Sag(4) 5.5" Over Hang @ 120° C. mm |
|---|---|---|---|---|---|---|---|
| 1A | 600 | — | 1 | — | — | — | — |
| 1B | 600 | 1 | | | | | |
| 2A | 600 | — | 2 | — | — | — | — |
| 2B | 600 | 2 | | | | | |
| 3A | 600 | — | 3 | 1.78 | 108 | 8.5 | — |
| 3B | 600 | 3 | | | | | |
| 4A | 600 | — | 4 | 1.78 | 104 | 8.5 | — |
| 4B | 600 | 4 | | | | | |
| 5A | 600 | — | 5 | 1.5 | 106 | 9.0 | 6 |
| 5B | 600 | 5 | (2) | | | | |
| CA# | 600 | — | CTRL | 1.0 | 105 | 8.5 | 12 |
| CA# | 600 | 0 | (3) | | | | |

(1) Dicyclopentadiene with 3.5% EPDM rubber & 2% Ethylidene norbornene.
(2) $T_g$ = 138° C.
(3) $T_g$ = 130° C.
(4) ASTM 3769

TABLE 2

PROPERTIES AFTER POST CURING (@ 220° C.)

| Ex. Prop. | Flexural Mod. kpsi | Flexural Str. kpsi | HDT @ 264 psi °C. | Notched Izod ft-lbs/in | $T_g$ °C. | $G_{p'}$, (1) $\times 10^{-8}$ dynes/cm$^2$ |
|---|---|---|---|---|---|---|
| 1 | 317 | 10.7 | 181 | 0.58 | 200 | 7 |
| 2 | 351.2 | 7.3 | >205 | — | 280 | 30 |
| 3 | — | — | — | — | — | — |
| 4 | 365.4 | 5.5 | >205 | — | 340 | 50 |
| 5 | 376 | 8.8 | >205 | — | 340 | 50 |
| Ctrl. | 273 | 10.9 | 137 | 2.1 | 160 | 2.3 |

(1) $G_{p'}$, = plateau modulus obtained from dynamic mechanical analysis, the higher the plateau modulus, the higher the crosslink density (lower the molecular weight between crosslinks).

TABLE 3

PROPERTIES OF CARBON FIBER COMPOSITE

Tensile Modulus = 5.8 × 10$^6$ psi
Tensile Strength = 57,900 psi
Tensile Elongation = 1%
Compressive Strength = 33,100 psi

TABLE 4

| PROPERTIES OF GLASS FIBER COMPOSITE | | |
|---|---|---|
| | AS MOLDED | POST CURED |
| Notched Izod (ft-lbs/in) | 17.6 | 11.8 |
| Heat Deflection Temp. @ 264 psi (°C.) | 142 | >200 |
| $T_g$ (°C.) | 146 | >340 |
| Tensile Modulus (kpsi) | 666.9 | 689.6 |
| Tensile Strength (kpsi) | 13.6 | 4.1 |
| Tensile Elongation (%) | 2.8 | 2.5 |
| Flexural Modulus | 703.8 | 686.8 |
| Flexural Strength (kpsi) | 18.6 | 11.34 |

We claim:

1. A molded article comprising a cross-linked ring-opened polymer produced by the metathesis polymerization of a dicyclopentadiene monomer, or a mixture of dicyclopentadiene and at least one other norbornene group-containing cycloolefin, in the presence of an effective amount of a metathesis polymerization catalyst and 0.01 to 5% by volume based on the total volume of the monomer of a co-catalyst selected from the group consisting of trifluoromethane sulfonic anhydride, 1,2-diphenyl-tetramethyldisilane, 2,3-dimethyl-2-3, diphenylbutane, benzene-sulfonic acid and trifluoroacetic anhydride, the said co-catalyst is capable of crosslinking the unsaturated double bonds of the polymer thereby increasing the crosslink density of the polymer and its glass transition temperature $T_g$, the said molded article having a $T_g$ of at least 200° C.

2. The molded article as claimed in claim 1, in which the co-catalyst is trifluoromethane sulfonic anhydride.

3. A molded article consisting of the crosslinked polymer composition of claim 1 that has a $T_g$ of 200° to 340° C.

4. A dielectric support for electronic components of a circuit board comprising a post cured polymer article as claimed in claim 1.

5. A molded article consisting of the crosslinked polymer composition of claim 1 that has flexural modulus of 317 to 376 kpsi.

6. A molded article as claimed in claim 1 wherein the polymerization is carried out in the presence of 0.33 to 0.4 by the volume of the co-catalyst, the co-catalyst being trifluoromethane sulfonic anhydride and the $T_g$ of the molded article being 340° C.

* * * * *